United States Patent [19]

Nishida et al.

[11] Patent Number: 5,103,851
[45] Date of Patent: Apr. 14, 1992

[54] SOLAR BATTERY AND METHOD OF MANUFACTURING THE SAME

[75] Inventors: Shoji Nishida, Nagahama; Takao Yonehara, Atsugi, both of Japan

[73] Assignee: Canon Kabushiki Kaisha, Tokyo, Japan

[21] Appl. No.: 623,526

[22] Filed: Dec. 7, 1990

[30] Foreign Application Priority Data

Dec. 11, 1989 [JP] Japan ................................. 1-320824

[51] Int. Cl.$^5$ ................ H01L 31/075; H01L 31/0352; H01L 31/18
[52] U.S. Cl. ................................. 136/249; 136/258; 437/4; 437/89
[58] Field of Search .......... 136/244, 249 MS, 249 TJ, 136/258 PC; 437/2–5, 89–92

[56] References Cited

U.S. PATENT DOCUMENTS 4,633,030 12/1986 Cook ................................. 136/246
4,784,701 11/1988 Sakai et al. ................... 136/249 TJ

FOREIGN PATENT DOCUMENTS 1-51671  2/1989 Japan ............................. 136/258 PC
1-149483 6/1989 Japan ............................. 136/258 PC

OTHER PUBLICATIONS

"Fundamentals of Solar Cells", A. L. Fahrenbruch et al., Academic Press (1983) pp. 28–32.

Primary Examiner—Aaron Weisstuch
Attorney, Agent, or Firm—Fitzpatrick, Cella, Harper & Scinto

[57] ABSTRACT

A solar battery characterized in the following respects of having at least one semiconductor multilayer structure (A) having at least, an electrode ($a_1$); a semiconductor crystal ($a_2$) of a first conductivity type formed on the electrode ($a_1$); and at least one set of laminate layers consisting of a high resistance semiconductor layer ($a_3$) and a semiconductor layer ($a_4$) of a second conductivity type and a semiconductor layer ($a_5$) of the first conductivity type which sequentially formed so as to cover the semiconductor crystal ($a_2$) of the first conductivity type and at least one semiconductor multilayer structure (B) having at least: an electrode ($b_1$); a semiconductor crystal ($b_2$) of the second conductivity type formed on the electrode ($b_1$); and at least one set of laminate layers consisting of a high resistance semiconductor layer ($b_3$) and a semiconductor layer ($b_4$) of the first conductivity type and a semiconductor layer ($b_5$) of the second conductivity type which are alternately arranged on the same insulative substrate. The semiconductor multilayer structure sections (A) and (B) are alternately electrically connected by high resistance semiconductor layers (C) formed so as to cover the semiconductor multilayer structure sections (A) and (B). The surfaces of the high resistance semiconductor layers (C) form light receiving surfaces.

7 Claims, 7 Drawing Sheets

SOLAR BATTERY AND METHOD OF MANUFACTURING THE SAME

BACKGROUND OF THE INVENTION

1. Field of the Invention

The present invention relates to a solar battery of the multilayer structure type and its manufacturing method and, more particularly, to a multilayer structure type solar battery in which energy converting efficiency was improved and a method of manufacturing such a battery.

2. Related Background Art

Hitherto, a solar battery has been used as a driving energy source in various kinds of apparatuses.

The conventional solar battery generally has a structure using a pn junction or a pin junction. FIG. 2 is a diagrammatical cross sectional view showing a cross sectional structure of a conventional solar battery having a pn junction. As a semiconductor constituting a pn junction or pin junction, Si of group IV of the periodic table, GaAs or InP as a compound of groups III and V, or the like is used. However, generally, Si is used.

In such a solar battery, hitherto, there has been much research to improve the efficiency (hereinafter, referred to as energy converting efficiency) for converting light energy into electric energy. Various examinations have been conducted.

In FIG. 2 herein, the solar battery has two semiconductor layers of opposite conductive types, namely p-type 203 and n-type 202 with a depletion region at the interface of the two layers. On the top of the battery, there is a metal grid 205 for an electrode covered with an anti-reflecting layer 204, which collects the generated carriers in the semiconductor layers when light impinges onto the surface of the battery. An electric current can be utilized when an external closed circuit is connected in front electrode 205 and back electrode 201.

For a conventional solar battery having a pin junction, the structure of the battery is slightly changed compared to that of the pn junction, that is, an intrinsic semiconductive layer with a high resistivity is inserted between p-type and n-type layers. The structure of this type is commonly used in a solar battery which is composed of amorphous Si related materials.

The crystalline properties of a semiconductor serving as a functional portion of a solar battery are significant factors determining the energy converting efficiency. Polycrystal semiconductors are superior to amorphous semiconductors with respect to the energy converting efficiency. Monocrystal semiconductors are better than polycrystal materials in energy converting efficiency. However, the use of a monocrystalline semiconductor substrate is disadvantageous from the viewpoints of realization of a large area and low cost.

On the other hand, the structure of the solar battery is also important as a factor determining the energy converting efficiency. In the case of the solar battery having a pn junction or pin junction, by using a tandem or triple structure by laminating semiconductor layers having different band gaps, the energy converting efficiency can be improved. This is because in the tandem or triple structure using semiconductor layers having different band gaps, the light can be efficiently absorbed in a wide range from short wavelengths to long wavelengths.

However, in the solar battery having a pn junction or pin junction, as shown in FIG. 2, since the light enters perpendicularly to the pn junction surface, it is necessary that the photogenerated charge carriers diffuse in a semiconductor layer in which the lifetime of minority carriers is short due to the impurities added in the layer. Also, the solar battery is influenced by recombination at the interface between the semiconductor layer and the reflection preventing layer or metal electrode, and further, since a collecting electrode is formed on the light incident surface, the effective area of light incidence is reduced. The above mentioned factors deteriorate the energy converting efficiency. Therefore, even in the case of using an Si monocrystal, the energy converting efficiency of the solar battery as shown in FIG. 2 is at most about 15 to 18%.

As a solar battery which can cope with such structural problems, a Si solar battery of the point contact type has been proposed (R. A. Sinton, Y. Kwark, J. Y. Gan, R. M. Swanson, *IEEE Electron Device Letters*, Vol. EDL-7, No. 10, pages 567 to 569, October, 1986). FIG. 3 shows a diagrammatical cross sectional view of the point contact type solar battery. This type of solar battery has a substrate of high resistance semiconductor wherein several small p- and n-type areas are formed at the back surface side (they constitute pin junctions in parallel with the substrate) and has no electrode located at the front surface which is covered with a thin oxide film. Such a solar battery structure has the following advantages. A high resistance semiconductor layer when used as an active layer extends the lifetime of the minority carriers. Since the surface of the semiconductor layer is covered by an oxide film, the influence of surface recombination can be reduced. Since a pin junction is formed on the back surface side of the substrate in parallel with the substrate and point contacts are provided by the metal electrodes, the entire substrate surface is available, so that the light incidence can be effectively 100%. Further, since the surface has been textured, the light absorbing efficiency of, in particular, long wavelength light can be raised due to a light trapping effect. In a solar battery shown in FIG. 3, a high converting efficiency of 22% at AM1.5 to 27.5% under 100 suns is obtained.

However, since a solar battery with such a structure uses monocrystalline Si as the substrate material, there are drawbacks such that the manufacturing costs are high, it is necessary to make a thin film cell (thickness of 60 to 100 μm) by polishing in order to reduce Auger recombination due to concentration of surface carriers, and the like. Such circumstances are similarly caused with compound semiconductors as well as with silicon.

To solve the above drawbacks, as a thin film solar battery having a large enough crystal grain diameter and a high energy converting efficiency, there has been proposed "a solar battery made of a semiconductor crystal having a mountain-shaped facet-like surface which is provided on a non-nucleating surface having a nucleating surface portion whose nucleating density is significantly larger than that of the non-nucleating surface and whose surface area is small enough to generate only a single nucleus, characterized in that the mountain-shaped facet-like surface forms a light receiving surface" (Japanese Patent Application No. 63-210358, not published before the filing date of the present invention). According to the above, a solar battery of the point contact type having a high energy converting efficiency can be cheaply provided on a non-singlecrystalline substrate.

However, according to the solar battery disclosed in Japanese Patent Application No. 63-210358, since the pin junction is located in parallel with the substrate, there is a problem that it is impossible to use a tandem or triple structure in which semiconductor layers are laminated as in the conventional solar battery of the pn junction or pin junction.

SUMMARY OF THE INVENTION

The present invention is made in consideration of the problems of the conventional techniques and it is an object of the invention to provide a solar battery further improved in energy converting efficiency.

Another object of the invention is to provide an optimum method of manufacturing such a highly efficient solar battery.

Still another object of the invention is to provide a solar battery characterized in that at least one semiconductor multilayer structure (A) having at least: an electrode ($a_1$); a semiconductor crystal ($a_2$) of a first conductivity type formed on the electrode ($a_1$); and at least one set of laminate layers consisting of a high resistance semiconductor layer ($a_3$) and a semiconductor layer ($a_4$) of a second conductivity type and a semiconductor layer ($a_5$) of the first conductivity type which are sequentially formed so as to cover the semiconductor crystal ($a_2$) of the first conductivity type and at least one semiconductor multilayer structure (B) having at least: an electrode ($b_1$); a semiconductor crystal ($b_2$) of the second conductivity type formed on the electrode ($b_1$); and at least one set of laminate layers consisting of a high resistance semiconductor layer ($b_3$) and a semiconductor layer ($b_4$) of the first conductivity type and a semiconductor layer ($b_5$) of the second conductivity type are alternately arranged on the same insulative substrate, the semiconductor multilayer structure sections (A) and (B) are alternately electrically connected by high resistance semiconductor layers (C) formed so as to cover the semiconductor multilayer structure sections (A) and (B), and the surfaces of the high resistance semiconductor layers (C) form light receiving surfaces.

DETAILED DESCRIPTION OF THE PREFERRED EMBODIMENTS

Figure 1A:
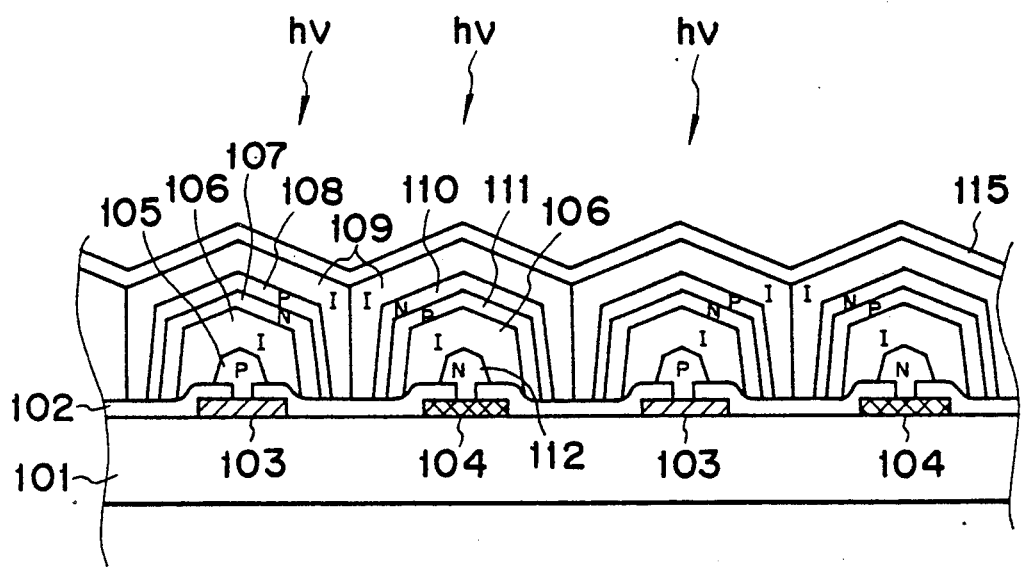
FIG. 1A is a diagrammatical cross sectional view showing an example of a construction of a solar battery according to the invention.

According to a preferred embodiment of the present invention, there is provided a solar battery characterized in that at least one semiconductor multilayer structure (A) having at least: an electrode ($a_1$); a semiconductor crystal ($a_2$) of a first conductivity type formed on the electrode ($a_1$); and at least one set of laminate layers consisting of a high resistance semiconductor layer ($a_3$) and a semiconductor layer ($a_4$) of a second conductivity type and a semiconductor layer ($a_5$) of the first conductivity type which are sequentially formed so as to cover the semiconductor crystal ($a_2$) of the first conductivity type and at least one semiconductor multilayer structure (B) having at least: an electrode ($b_1$); a semiconductor crystal ($b_2$) of the second conductivity type formed on the electrode ($b_1$); and at least one set of laminate layers consisting of a high resistance semiconductor layer ($b_3$) and a semiconductor layer ($b_4$) of the first conductivity type and a semiconductor layer ($b_5$) of the second conductivity type are alternately arranged on the same insulative substrate, the semiconductor multilayer structure sections (A) and (B) are alternately electrically connected by high resistance semiconductor layers (C) formed so as to cover the semiconductor multilayer structure sections (A) and (B), and the surfaces of the high resistance semiconductor layers (C) form light receiving surfaces.

According to a preferred embodiment of the invention, there is provided a method of manufacturing a solar battery comprising at least the steps of:

forming a region serving as a non-nucleating surface on an insulative substrate on which electrodes ($a_1$ and $b_1$) are formed;

providing a contact hole in the non-nucleating surface on the electrode ($a_1$), thereby exposing the surface of the electrode ($a_1$) serving as a nucleating surface whose nucleating density is significantly larger than that of the non-nucleating surface and whose surface area is small enough to generate only a single nucleus;

selectively forming a monocrystal only on the nucleating surface, thereby forming a semiconductor crystal ($a_2$) of a first conductivity type;

providing a contact hole in the non-nucleating surface on the electrode ($b_1$), thereby exposing the surface of the electrode ($b_1$) serving as a nucleating surface whose nucleating density is significantly larger than that of the non-nucleating surface and whose surface area is small enough to generate only a single nucleus;

selectively forming a monocrystal only on the nucleating surface, thereby forming a semiconductor crystal ($b_2$) of a second conductivity type;

forming a high resistance semiconductor layer ($a_3$) on the semiconductor crystal ($a_2$) of the first conductivity type and also forming a high resistance semiconductor layer ($b_3$) on the semiconductor crystal ($b_2$) of the second conductivity type;

sequentially forming a semiconductor layer ($a_4$) of the second conductivity type and a semiconductor layer (a$_5$) of the first conductivity type on the high resistance semiconductor layer (a$_3$);

sequentially forming a semiconductor layer (b$_4$) of the first conductivity type and a semiconductor layer (b$_5$) of the second conductivity type on the high resistance semiconductor layer (b$_3$); and forming high resistance semiconductor layers (C) on the semiconductor layer (a$_5$) of the first conductivity type and the semiconductor layer (b$_5$) of the second conductivity type, thereby electrically connecting the semiconductor layer (a$_5$) of the first conductivity type and the semiconductor layer (b$_5$) of the second conductivity type. It is preferred that the band gap of the high resistance semiconductor layers (a$_3$ and b$_3$) is smaller than the band gap of the high resistance semiconductor layers (C).

According to the invention, for instance, in the case where one set of laminate layers comprising the high resistance semiconductor layer (a$_3$) and the semiconductor layer (a$_4$) of the second conductivity type and the semiconductor layer (a$_5$) of the first conductivity type and one set of laminate layers comprising the high resistance semiconductor layer (b$_3$) and the semiconductor layer (b$_4$) of the first conductivity type and the semiconductor layer (b$_5$) of the second conductivity type are used, three pin junctions can be formed in a combination of one set of the semiconductor sections (A) and (B). That is, the first set of pin junctions is formed by the mountain-shaped facet-like semiconductor crystal (a$_2$) of the first conductivity type, high resistance semiconductor layer (a$_3$), and semiconductor layer (a$_4$) of the second conductivity type. The second set of pin junctions is formed by the semiconductor layer (a$_5$) of the first conductivity type, high resistance semiconductor layer (C), and semiconductor layer (b$_5$) of the second conductivity type. Further, the third set of pin junctions is formed by the semiconductor layer (b$_4$) of the first conductivity type, high resistance semiconductor layer (b$_3$), and mountain-shaped facet-like semiconductor crystal (b$_2$) of the second conductivity type. On the other hand, in the case of using a plurality of sets of the above laminate layers, a larger number of pin junctions can be formed.

Therefore, according to the invention, by forming the pin junctions using a semiconductor having different band gaps, respectively, it is possible to provide a point contact type solar battery which uses a tandem structure.

A manufacturing method of the solar battery of the invention selectively grows a monocrystal by using regions of the non-nucleating surface and the nucleating surface. The general principle of the selective monocrystal growing method will now be briefly explained.

According to the selective monocrystal growing method, a crystal is selectively grown on a substrate by using differences in properties between materials, such as surface energy, attachment coefficient, desorption coefficient, surface diffusion speed, and the like which exert an influence on nucleus formation during the thin film forming steps. That is, a monocrystal is grown on the nucleating surface which is formed on the non-nucleating surface (surface of small nucleus forming density) and whose nucleus forming density is significantly larger than that of the non-nucleating surface and whose surface area is small enough to generate only a single nucleus. According to the above method, no crystal is grown from the non-nucleating surface but the generation of a nucleus takes place only from the nucleating surface and monocrystal growth results.

Figure 6A:
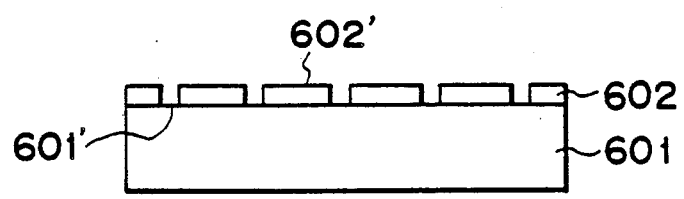
FIGS. 6A to 6C are diagrammatical cross sectional views for explaining a selective monocrystal growing method which is used in the solar battery manufacturing method of the invention.
Figure 6B:
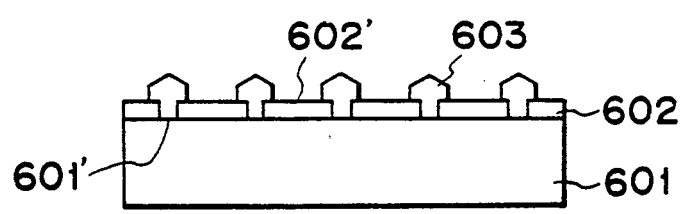
Figure 6C:
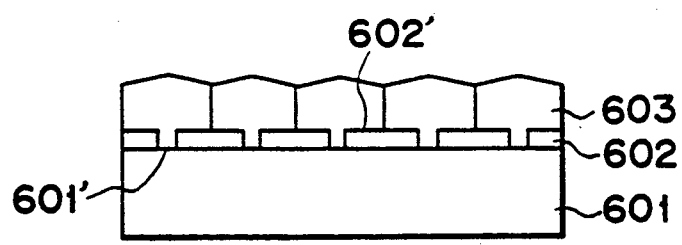

FIGS. 6A to 6C are diagrams showing the stages of crystal growth mentioned above. In the diagram, reference numeral 601 denotes an insulative substrate, 601' a nucleating surface; 602 and 602' a film which forms a non-nucleating surface.

As materials which can be used in the selective monocrystal growing method, for instance, SiO$_x$, Si$_3$N$_4$, or the like can be used for the non-nucleating surface, Si, GaAs, Si$_3$N$_4$, metal, or the like can be used for the nucleating surface, and Si, GaAs, InP, metal, or the like can be used for the crystal to be grown. However, the same compositions Si$_3$N$_4$ cannot be used for the non-nucleating surface and the nucleating surface.

An embodiment of the solar battery of the invention will now be described with reference to the drawings.

FIG. 1A is a diagrammatical cross sectional view showing an example of a construction of the solar battery of the invention.

As shown in FIG. 1A, according to the solar battery of the diagram, collecting electrodes 103 and 104 are arranged on an insulative substrate 101. Parts of the surfaces of the electrodes 103 and 104 are respectively in contact with semiconductor crystals (p-type semiconductor crystal 105 and n-type semiconductor crystal 112) through holes formed in an insulative layer 102. A high resistance semiconductor layer (i layer) 106 into which no impurity has been added and in which the lifetime of minority carriers is long, semiconductor layers (n-type semiconductor layer 107 and p-type semiconductor layer 111) of conductivity type opposite to the conductivity type of the associated semiconductor crystal, and semiconductor layers (p-type semiconductor layer 108 and n-type semiconductor layer 110) of the same conductivity type as that of the associated semiconductor crystal are sequentially formed onto the associated semiconductor crystals, respectively. Further, high resistance semiconductor layers (i layer) 109 are formed onto the surfaces of the p-type semiconductor layer 108 and then n-type semiconductor layer 110. The adjacent mountain-shaped facet-like multilayer structure semiconductors are in contact with each other through the high resistance semiconductor layers 109. The top portions of the semiconductors are covered by a passivation film 115.

Figure 1B:
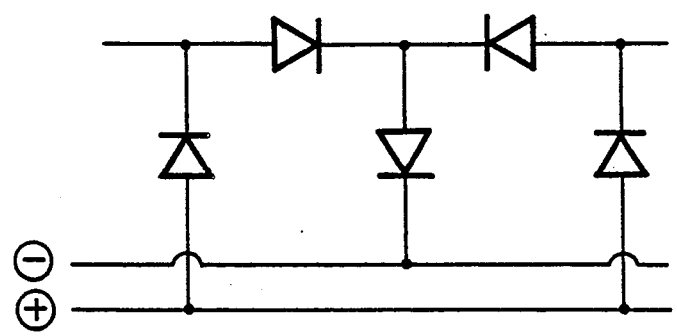
FIG. 1B is an equivalent circuit diagram of the solar battery shown in FIG. 1A.
Figure 2:
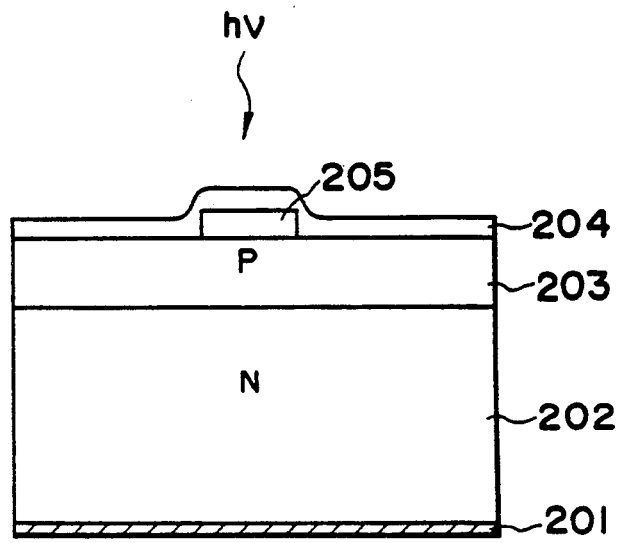
FIG. 2 is a diagrammatical cross sectional view showing an example of a conventional solar battery.
Figure 3:
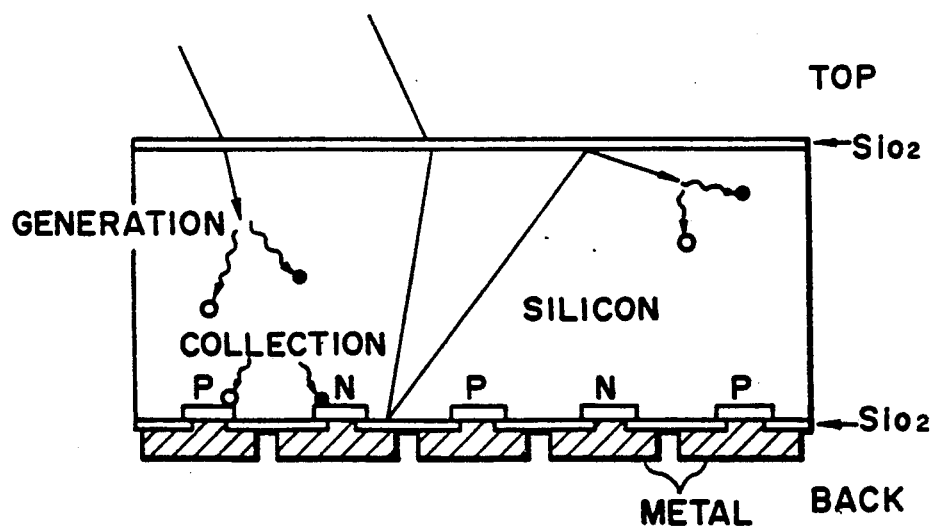
FIG. 3 is a diagrammatical cross sectional view showing another example of a conventional point contact layer solar battery.

The current path of the solar battery is as shown in FIG. 1B. Diodes of three stages are coupled, thereby forming a solar battery of triple structure. Therefore, for instance, if the semiconductor layers (semiconductor crystals) 105, 106, 107, 111 and 112 are formed by Si monocrystals and the semiconductor layers 108, 109 and 110 are formed by GaAs monocrystals, an open circuit voltage of $V_{oc} = 0.6 + 0.7 + 0.6 = 1.9$ (V) or higher can be obtained. On the other hand, the exposure of the light incident surface is equal to 100%. Each of the high resistance semiconductor layers 106 and 109 in which a lifetime of minority carriers is long and the band gas are different is formed as an active layer. Therefore, the light can be effectively absorbed and the generated carriers can be collected. Materials for forming the semiconductor layers (semiconductor crystals) 105, 106, 107, 108, 109, 110, 111 and 112 can be selected from semiconductors such as Si, GaAs, InP, SiGe, SiC, ZnSe, ZnS, and the like, However, to effectively absorb the light, it is desirable to make the band gap of the high resistance semiconductor layer 106 smaller than that of the high resistance semiconductor layer 109.

Manufacturing steps of the solar battery of the example will now be described with reference to FIGS. 4A to 4H.

Figure 4A:
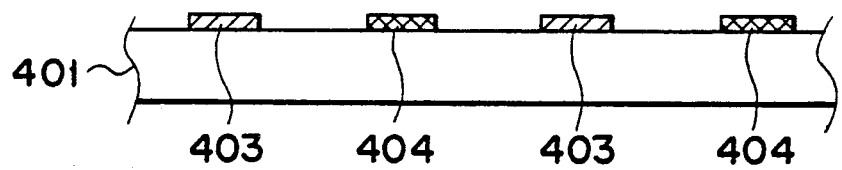
FIGS. 4A to 4H are diagrammatical cross sectional views showing an example of processing steps of a solar battery manufacturing method of the invention.

(1) First, a metal is evaporated onto substrate 401 by sputtering. Comb-shaped electrodes and collecting electrodes 403 and 404 serving as nucleating surfaces are formed by patterning (FIG. 4A).

It is generally preferred that the width of each of the collecting electrodes 403 and 404 be within the range from 5 to 180 μm although it depends on the size of the nucleating surface, which will be explained below. On the other hand, it is also desirable that the distance between the centers of the electrodes be within the range from 20 to 200 μm although it is determined by the spacing between the nucleating surfaces. The thickness of the electrodes is desirably 0.3 μm or more. The substrate 401 is formed by an insulative material such as quartz, ceramics, or the like; any material having a certain degree of heat resistance can be used. Although the collecting electrodes 403 and 404 have been formed by different materials in the embodiment, they can be formed by the same metal having a relatively high melting point. For instance, Mo, W, or the like can be used.

Figure 4B:
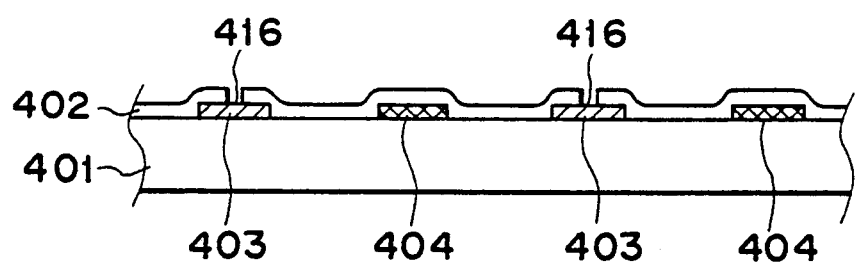

(2) An insulative film 402 serving as a non-nucleating surface and having a thickness of 500 to 1000 Å is the deposited by an ordinary CVD process. First, a contact hole 416 only for the p-type collecting electrode 403 is opened by etching, thereby exposing the nucleus forming surface (FIG. 4B). It is preferable to form the insulative film 402 from $SiO_2$, $Si_3N_4$, or the like.

Figure 4C:
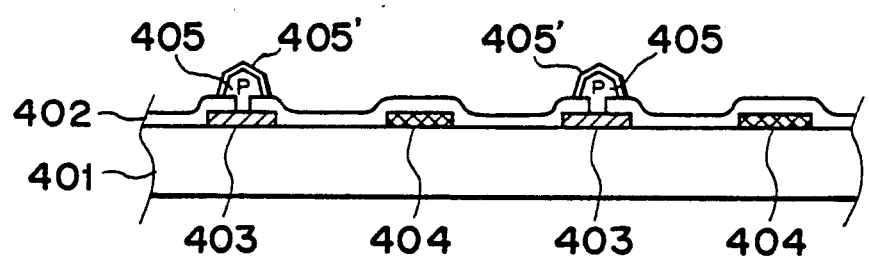
Figure 4D:
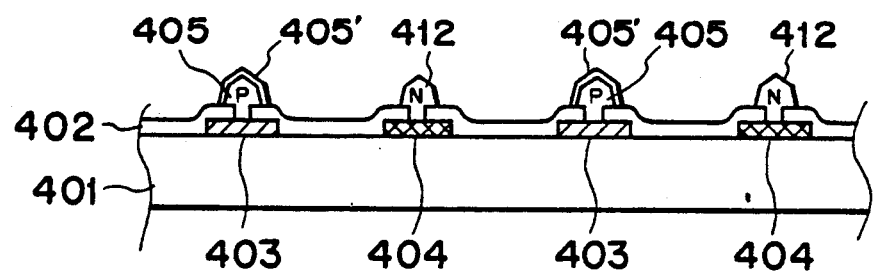
Figure 4E:
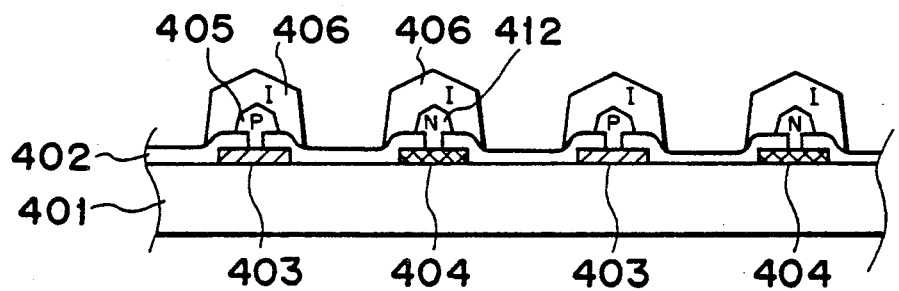
Figure 4F:
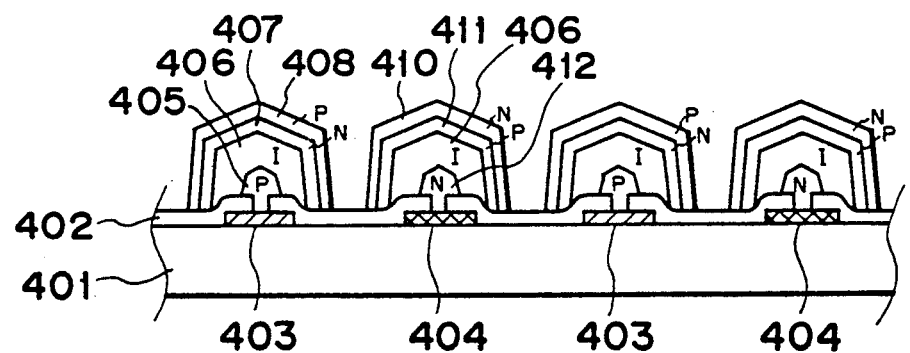
Figure 4G:
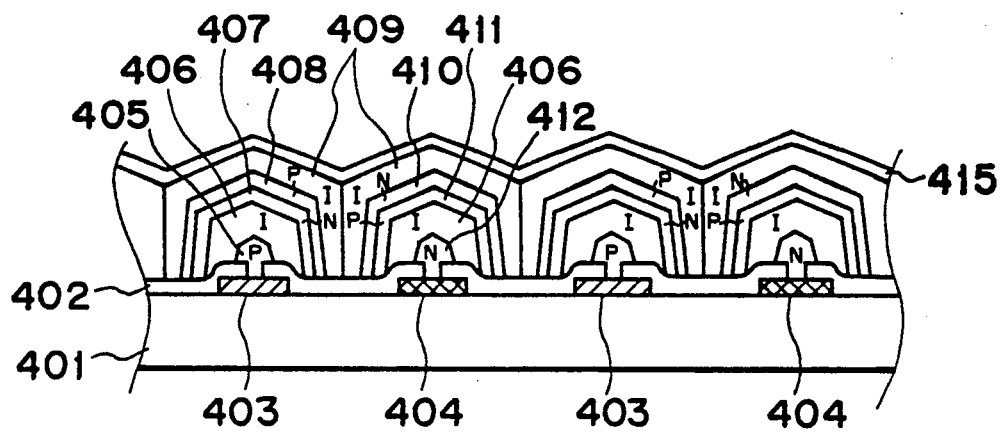
Figure 4H:
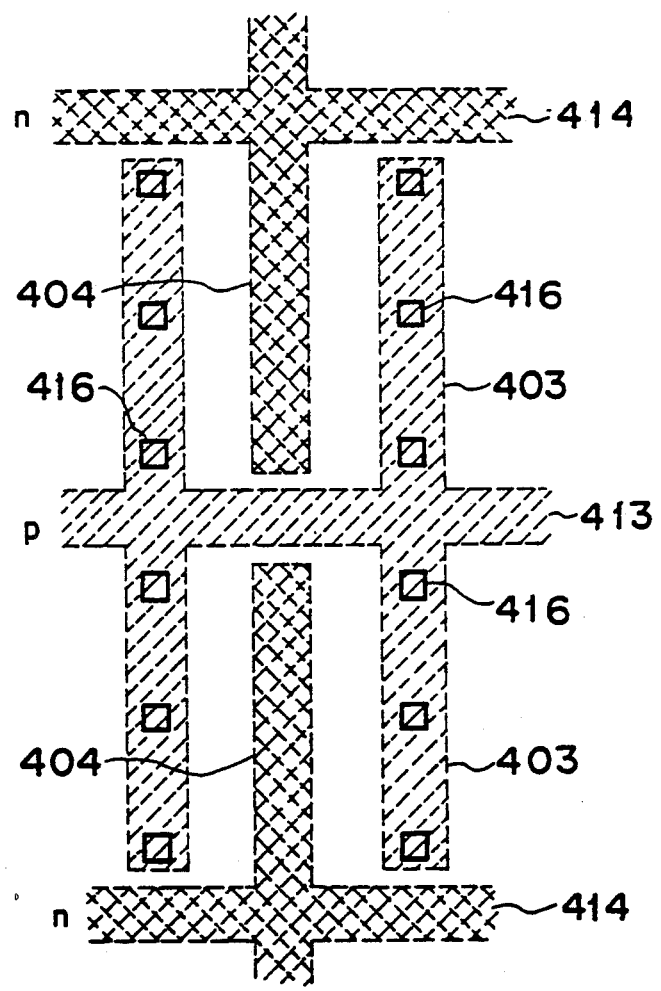

FIG. 4H is a plan view showing an example of a pattern of the nucleating surface which is formed at this time. In the diagram, reference numerals 413 and 414 denotes bus bars for the p-type and the n-type, respectively, and are used to transfer photocurrents which were collected by the collecting electrodes 403 and 404 to an external circuit. The size of the nucleating surface 416 is preferably 6 μm square or less, more desirably, it is 4 μm square or less, although it is best determined by the material, forming conditions, and the like of the semiconductor which is formed.

(3) A p-type semiconductor crystal 405 is then grown on the exposed nucleating surface 416 by using the foregoing selective monocrystal growing method, thereby obtaining a mountain-shaped facet. When a growing nucleus reaches a certain size, the growth is stopped. A thin $SiO_2$ film or an $Si_3N_4$ film 405' or the like having a thickness of about 100 to 300 Å is formed on each surface of the mountain-shaped monocrystal 405 by using the same CVD method as mentioned above (FIG. 4C).

The size of the mountain-shaped facet-like monocrystal 405 is ordinarily set to a value within a range from 2 to 10 μm although it is best determined by the film thickness of the whole multilayer semiconductor layer which is formed, that is, by the construction of the solar battery.

(4) In a manner similar to the step (2), a contact hole is then opened in the insulative film 402 on the n-type collecting electrode 404, thereby exposing a nucleating surface. In a manner similar to the step (3), an n-type semiconductor crystal 412 is grown by the selective monocrystal growing method (FIG. 4D). At this time, since the insulative film 405' of a small nucleus forming density has been formed on the surface of the p-type semiconductor crystal 405, the n-type semiconductor crystal does not grow on such a surface. The size of semiconductor crystal 412 is within the range from 2 to 10 μm in a manner similar to the p-type crystal 405.

(5) The insulative film 405' on the surface of the semiconductor crystal 405 is then removed by etching, thereby again exposing the crystal surface. After that, the p-type semiconductor crystal 405 and the n-type semiconductor crystal 412 are used as seeds and an i-type semiconductor layer 406 is formed by the selective monocrystal growing method (FIG. 4E).

In this case, the surfaces of the p-type semiconductor crystal 405 and the n-type semiconductor crystal 412 become the nucleating surfaces. The film thickness of i-type semiconductor layer 406 is preferably within the range from 5 to 50 μm although it is best determined by the material of the semiconductor and the construction of the solar battery.

(6) Then, an insulative film ($SiO_2$ or $Si_3N_4$) having a thickness of about 100 to 300 Å is deposited by the CVD method. Only the surface of the i-type semiconductor layer 406 formed on the p-type semiconductor crystal 405 is exposed by etching. An n-type semiconductor layer 407 is formed on the exposed surface in a manner similar to the step (3). After that, an insulative film of a thickness of 100 to 300 Å is further deposited by the CVD method. Then, only the surface of the i-type semiconductor layer 406 on the n-type semiconductor crystal 412 is exposed. A p-type semiconductor layer 411 is formed in a manner similar to the above described n-type layer 407 (FIG. 4F).

(7) Further, by repeating a process similar to the foregoing step (6), a p-type semiconductor layer 408 is formed on the n-type semiconductor layer 407 and an n-type semiconductor layer 410 is formed on the p-type semiconductor layer 411. The film thicknesses of semiconductor layers 407, 408, 410 and 411 are within the range about from 0.1 to 5 μm although they are best determined in dependence on the material of the semiconductors and the construction of the solar battery.

(8) With the surfaces of the semiconductor layers 408 and 410 exposed, i-type semiconductor layers 409 are then grown on those surfaces until the i-type semiconductor layers 409 finally come into contact with each other (FIG. 4G).

The i-type semiconductor layer 409 is not limited to single crystals but can be also formed as polycrystalline or amorphous. On the other hand, the method of forming the i-type semiconductor 409 is not limited to the selective monocrystal growing method but it is also possible to use an ordinary method such as atmospheric pressure CVD method, low pressure (LP) CVD method, plasma CVD method, or the like.

(9) Finally, a passivation film 415 ($SiO_2$, $Si_3N_4$, etc.) having a thickness of 500 to 1000 Å is formed on the surface of the multilayer structure semiconductor by a CVD method (FIG. 4G).

The above-described construction of solar battery and its manufacturing method illustrate the case where one set of laminate layers comprising the i-type semiconductor layer 406, n-type semiconductor layer 407, and p-type semiconductor layer 408 and one set of laminate layers comprising the i-type semiconductor layer 406, p-type semiconductor layer 411, and n-type semiconductor layer 410 are used. However, a plurality of sets of these laminate layers can also be used in the solar battery. A solar battery having a structure in which two or more sets of those laminate layers are used is realized by alternately repeating the processes in steps (5) and (6) a plurality of times. In this case, assuming that n sets of these two kinds of laminate layers are laminated, the number of pin junction diodes which are constructed as a circuit is expressed by 2n+1. In this case as well, it is desirable that the band gaps of the semiconductors which are used as materials of the high resistance layers sequentially decrease as viewed from the light incident side.

Practical embodiments of the solar battery of the invention will now be described. However, the invention is not limited by those embodiments.

Embodiment 1

A solar battery with the construction shown in FIG. 1 was manufactured by the selective monocrystal growing method in accordance with the manufacturing steps shown in FIGS. 4A to 4H by using Si for the semiconductor layers 105, 106, 107, 111 and 112 and GaAs for the semiconductor layers 108, 109 and 110.

The manufacturing steps of the solar battery of the embodiment will now be described.

(1) A layer of W having a thickness of 0.4 μm was deposited on an insulative substrate 401 of $Al_2O_3$ by sputtering and the collection electrodes 403 and 404 as shown in FIG. 4H were formed (FIG. 4A).

(2) An $SiO_2$ film non-nucleating surface was then deposited to a thickness of 1000 Å by the atmospheric pressure CVD method. Contact holes 416 were opened in the collecting electrode 403 so that the size of the nucleating surface was 4 μm square with a spacing of 100 μm, and the nucleating surfaces (W) were exposed (FIG. 4B).

(3) The mountain-shaped facet-like p-type Si crystals 405 were grown by the selective monocrystal growing method until a grain diameter of 6 μm are obtained (FIG. 4C). At this time, the growing conditions were such that the flow rate ratio of the raw material gases was $SiH_2Cl_2:HCl:H_2:B_2H_6=0.54:1.4:100:0.03$ (l/min), the temperature of the substrate was 900° C., and the pressure was 150 Torr.

(4) Then, an $SiO_2$ film having a thickness of 200 Å was deposited on the whole substrate surface by the atmospheric pressure CVD method. Contact holes were opened in the collecting electrode 404 in a manner similar to the step (2). The n-type Si crystals 412 were grown until a grain diameter of 6 μm was obtained (FIG. 4D). The growing conditions at this time were substantially the same as those in step (2) except that $PH_3$ was used as a dopant in place of $B_2H_6$.

(5) The oxide film 405' on the p-type Si crystal 405 was removed by etching using an HF solution. After that, the p-type Si layer 405 and the n-type Si layer 412 were used as seeds and the i-type Si layers 406 were grown under the conditions such that $SiH_2Cl_2:HCl:H_2=0.54:2.0:100$ (l/min), the temperature of the substrate was 920° C., and the pressure was 150 Torr. The growing process was stopped when the grain diameter was equal to 70 μm.

(6) An $SiO_2$ film having a thickness of 200 Å was again deposited on the i-type Si crystal 406 by the atmospheric pressure CVD method. Only the surface of the i-type Si crystal 405 formed on the p-type Si crystal was exposed. The n-type Si layer 407 was grown under the same conditions as the n-type Si crystal 412 until the film thickness was equal to 3 μm, that is, until the grain diameter of the whole multilayer semiconductor crystal was equal to about 76 μm. After that, an $SiO_2$ layer was again deposited. A p-type crystal having a film thickness of 3 μm was also grown on the surface of the i-type Si crystal formed on the n-type Si crystal 412 in a manner similar to the above under the same conditions as in the case of the foregoing p-type Si crystal 405.

(7) Then, a GaAs crystal was hereto epitaxially grown onto the above Si multilayer semiconductor by using an ordinary MOCVD process similar to that mentioned above. First, the p-type GaAs layer 408 was grown onto the n-type Si layer 407 and the n-type GaAs layer 410 was then grown onto the p-type Si layer 411. The ratio and flow rates of the raw material gases were trimethyl gallium (TMG):arsine $(AsH_3)=3\times10^{-5}:1.8\times10^{-4}$ (mole/min) and $H_2=3.0$ (l/min), and as a dopant, trimethyl zinc $(TMZn)=1.5\times10^{-6}$ mole/min was included for the p-type and selenium hydride $(H_2Se)=2\times10^{-7}$ mole/min was included for the n-type. The substrate temperature was 700° C. and the pressure was 80 torr. Film thickness of the p-type GaAs layer 408 and n-type GaAs layer 410 were 1 μm.

(8) With no $SiO_2$ on the surfaces of the GaAs layers 408 and 410, the i-type GaAs layers 409 were grown under the above conditions (no dopant is included) until the adjacent multilayer semiconductors finally came into contact with each other.

(9) Finally, an $SiO_2$ (passivation) layer having a thickness of 500 Å was deposited on the surface of the thus formed multilayer semiconductor.

The I-V characteristics of the multilayer structure type solar battery thus obtained as described above were measured under light irradiation of AM 1.5. When the cell area was 1 $cm^2$, the open voltage ($V_{oc}$) was 2.0 V, the short-circuit photocurrent ($J_{sc}$) 17.5 mA/$cm^2$, and the fill factor (FF) 0.77. The converting efficiency was 27%. Extremely high characteristics were obtained.

Embodiment 2

The solar battery of the construction shown in FIG. 1 was manufactured by using Si as the material of the semiconductor layers 105, 107, 108, 109, 110, 111 and 112 and SiGe as the material of the semiconductor layer 106, respectively.

The manufacturing steps of the solar battery of embodiment 2 will now be described.

(1) In a manner similar to the case of the embodiment 1, the mountain-shaped facet-like Si crystals 405 (p-type) and 412 (n-type) each having a size of 6 μm were grown onto the $Al_2O_3$ substrate 401. These crystals were then used as seeds and the i-type SiGe crystals 406 were grown under the conditions such that $SiH_2Cl_2:GeH_4:HCl:H_2=0.54:0.15:1.5:100$ (l/min), substrate temperature of 890° C., and pressure of 150 Torr. The growing process was stopped when the grain diameter was 50 μm.

(2) Then, in a manner similar to embodiment 1, the doped Si layers 407, 411, 408 and 410 each having a thickness of 3 μm were sequentially formed onto the SiGe crystals formed in the step (1). After that, the i-type Si crystals 409 were grown until the adjacent mountain-shaped multilayer semiconductors come into contact with each other. Finally, the $SiO_2$ film having a thickness of 500 Å was deposited onto the surface of the multilayer semiconductor, thereby forming the passivation film.

The I-V characteristics of the solar battery obtained as described above were measured under the light irradiation at AM 1.5. Thus, when the cell area was 1.5 $cm^2$, $V_{oc} = 1.62$ V, $J = 21.2$ mA/cm$^2$, and FF = 0.75. A very high converting efficiency of 25.8% was obtained.

Embodiment 3

Figure 5:
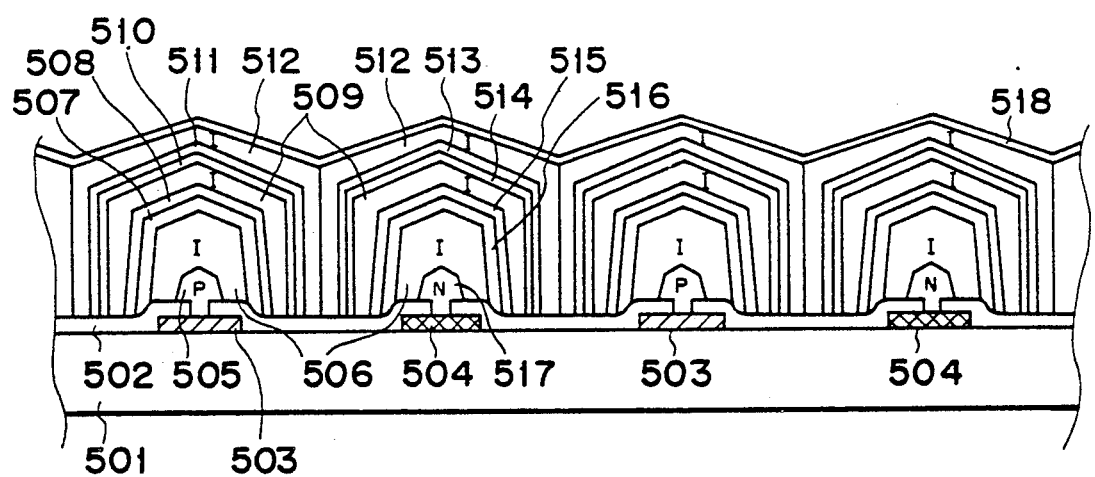
FIG. 5 is a diagrammatical cross sectional view showing another example of a construction of the solar battery of the invention.

In substantially the same manner as the cases of the embodiments 1 and 2, a solar battery of the construction shown in FIG. 5 was formed. Si was used as the material of semiconductor layers 505, 507, 508, 509, 510, 514, 515, 516 and 517. SiGe was used as the material of semiconductor layers 506, and GaAs was used as the material of the semiconductor layers 511, 512 and 513. The semiconductor layers were formed on the same substrate as used in embodiments 1 and 2. The forming conditions of the respective layers were identical to those of embodiments 1 and 2. Thicknesses of the p-type semiconductor layers and n-type semiconductor were identical to those in embodiments 1 and 2. With respect to the i-type semiconductor layers, the thickness of the SiGe layer 506 was set to 20 μm, the thickness of the Si layer 509 was about 12 μm, and the thickness of the GaAs layer 512 was about 5 μm.

The I-V characteristics of the solar battery of the embodiment formed as mentioned above were measured under light irradiation. Thus, for AM 1.5, $V_{oc} = 2.9$ V, $J_{sc} = 13.6$ mA/cm$^2$, and FF = 0.72. An extremely high converting efficiency of 28.4% was obtained.

As described in detail above, according to the solar battery of the invention, by laminating semiconductor layers having different band gaps, a solar battery having a triple or greater structure can be constructed. Due to this, a solar battery which can be remarkably improved in energy converting efficiency can be provided.

On the other hand, according to the solar battery manufacturing method of the invention, the solar battery of the invention can be cheaply manufactured using a non-singlecrystalline substrate.

What is claimed is:

1. A solar battery characterized in that
at least one semiconductor multilayer structure (A) having at least: an electrode (a$_1$); a semiconductor crystal (a$_2$) of a first conductivity type formed on the electrode (a$_1$); and at least one set of laminate layers consisting of a high resistance semiconductor layer (a$_3$) and a semiconductor layer (a$_4$) of a second conductivity type and a semiconductor layer (a$_5$) of the first conductivity type which are sequentially formed so as to cover the semiconductor crystal (a$_2$) of the first conductivity type and
at least one semiconductor multilayer structure (B) having at least: an electrode (b$_1$); a semiconductor crystal (b$_2$) of the second conductivity type formed on the electrode (b$_1$); and at least one set of laminate layers consisting of a high resistance semiconductor layer (b$_3$) and a semiconductor layer (b$_4$) of the first conductivity type and a semiconductor layer (b$_5$) of the second conductivity type which are sequentially formed so as to cover the semiconductor crystal (b$_2$) of the second conductivity type and
are alternately arranged on the same insulative substrate,
the semiconductor multilayer structure sections (A) and (B) are alternately electrically connected by high resistance semiconductor layers (C) formed so as to cover the semiconductor multilayer structure sections (A) and (B), and
the surfaces of the high resistance semiconductor layers (C) form light receiving surfaces.

2. A solar battery according to claim 1, wherein the band gap of the high resistance semiconductor layers (a$_3$) and (b$_3$) is smaller than the band gap of the high resistance semiconductor layers (C).

3. A solar battery according to claim 1, wherein each of the semiconductor crystals and the semiconductor layers is made of a material selected from the group consisting of Si, GaAs, and SiGe.

4. A method of manufacturing a solar battery comprising the steps of:
forming a region serving as a non-nucleating surface on an insulative substrate on which electrodes (a$_1$ and b$_1$) are formed;
providing a contact hole in the non-nucleating surface on the electrode (a$_1$), thereby exposing the surface of the electrode (a$_1$) serving as a nucleating surface whose nucleating density is significantly larger than that of the non-nucleating surface and whose surface area is small enough to generate only a single nucleus; p1 selectively forming a monocrystal only on the nucleating surface, thereby forming a semiconductor crystal (a$_2$) of a first conductivity type;
providing a contact hole in the non-nucleating surface on the electrode (b$_1$), thereby exposing the surface of the electrode (b$_1$) serving as a nucleating surface whose nucleating density is significantly larger than that of the non-nucleating surface and whose surface area is small enough to generate only a single nucleus;
selectively forming a monocrystal only on the nucleating surface, thereby forming a semiconductor crystal (b$_2$) of a second conductivity type;
forming a high resistance semiconductor layer (a$_3$) on the semiconductor crystal (a$_2$) of the first conductivity type and also forming a high resistance semiconductor layer (b$_3$) on the semiconductor crystal (b$_2$) of the second conductivity type;
sequentially forming a semiconductor layer (a$_4$) of the second conductivity type and a semiconductor layer (a$_5$) of the first conductivity type on the high resistance semiconductor layer (a$_3$);
sequentially forming a semiconductor layer (b$_4$) of the first conductivity type and a semiconductor layer (b$_5$) of the second conductivity type on the high resistance semiconductor layer (b$_3$); and
forming high resistance semiconductor layers (C) on the semiconductor layer (a$_5$) of the first conductivity type and the semiconductor layer (b$_5$) of the second conductivity type, thereby electrically connecting the semiconductor layer (a$_5$) of the first conductivity type and the semiconductor layer (b$_5$) of the second conductivity type.

5. A method according to claim 4, wherein the band gap of the high resistance semiconductor layers (a$_3$ and b$_3$) is smaller than the band gap of the high resistance semiconductor layers (C).

6. A method according to claim 4, wherein each of the semiconductor crystals and the semiconductor layers is made of a material selected from the group consisting of Si, GaAs, and SiGe.

7. A method according to claim 4, wherein the region serving as the non-nucleating surface is made of SiO$_2$.

* * * * *

UNITED STATES PATENT AND TRADEMARK OFFICE
CERTIFICATE OF CORRECTION

PATENT NO. : 5,103,851
DATED : April 14, 1992
INVENTOR(S) : SHOJI NISHIDA, ET AL.

It is certified that error appears in the above-identified patent and that said Letters Patent is hereby corrected as shown below: On the title page:

IN [57] ABSTRACT

Line 10, "which" should read --which are--.

COLUMN 3

Line 38, "type" should read --type,--.
Line 51, "cross sectional" should read --cross-sectional--.
Line 56, "cross sectional" should read --cross-sectional--.
Line 58, "cross sectional" should read --cross-sectional--.
Line 61, "cross sectional" should read --cross-sectional--.
Line 64, "cross sectional" should read --cross-sectional--.
Line 67, "cross sectional" should read --cross-sectional--.

COLUMN 4

Line 26, "type" should read --type,--.

COLUMN 6

Line 18, "cross sectional" should read --cross-sectional--.
Line 59, "band gas" should read --band gaps--.
Line 65, "like," should read --like.--.

COLUMN 8

Line 64, "these" should read --those--.

COLUMN 10

Line 61, "come" should read --came--.

UNITED STATES PATENT AND TRADEMARK OFFICE
CERTIFICATE OF CORRECTION

PATENT NO.  : 5,103,851
DATED       : April 14, 1992
INVENTOR(S) : SHOJI NISHIDA, ET AL.

It is certified that error appears in the above-identified patent and that said Letters Patent is hereby corrected as shown below:

COLUMN 11

Line 39, "non-singlecrystalline" should read
         --non-single crystalline--.

COLUMN 12

Line 24, "nucleus; pl selectively" should read
         --nucleus; ¶ selectively--.

Signed and Sealed this

Thirty-first Day of August, 1993

Attest:

BRUCE LEHMAN

Attesting Officer     Commissioner of Patents and Trademarks